(12) United States Patent
Lahaug

(10) Patent No.: US 6,716,685 B2
(45) Date of Patent: Apr. 6, 2004

(54) METHODS FOR FORMING DUAL GATE OXIDES

(75) Inventor: Eric Lahaug, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/215,519

(22) Filed: Aug. 9, 2002

(65) Prior Publication Data

US 2004/0029328 A1 Feb. 12, 2004

(51) Int. Cl.$^7$ .................. H01L 21/00; H01L 21/84
(52) U.S. Cl. .................. 438/157; 438/275; 438/283
(58) Field of Search .................. 438/157, 263, 438/264, 275, 283

(56) References Cited

U.S. PATENT DOCUMENTS

| 6,037,224 A | * | 3/2000 | Buller et al. |
| 6,124,171 A | | 9/2000 | Arghavani et al. |
| 6,207,586 B1 | | 3/2001 | Ma et al. |
| 6,297,103 B1 | | 10/2001 | Ahn et al. |
| 6,331,492 B2 | | 12/2001 | Misium et al. |
| 6,342,437 B1 | | 1/2002 | Moore |
| 2002/0019142 A1 | | 2/2002 | Moore |

* cited by examiner

Primary Examiner—Phuc T. Dang
(74) Attorney, Agent, or Firm—Dinsmore & Shohl LLP

(57) ABSTRACT

Methods of forming dual gate oxides are provided. A first gate oxide layer and oxynitride layer is formed over a substrate. A portion of the first gate oxide and oxynitride layers is removed over a second area of the substrate, and a second gate oxide is formed thereon. The first gate oxide layer is simultaneously reoxidized. The reoxidized first gate oxide layer incorporates oxynitride and is thinner than a second gate oxide layer. Methods of forming the semiconductor devices and memory cells are also provided. It is emphasized that this abstract is provided to comply with the rules requiring an abstract which will allow a searcher or other reader to quickly ascertain the subject matter of the technical disclosure. It is submitted with the understanding that is will not be used to interpret or limit the scope or meaning of the claims.

22 Claims, 4 Drawing Sheets

METHODS FOR FORMING DUAL GATE OXIDES

BACKGROUND OF THE INVENTION

The present invention pertains to methods of forming oxide regions of varying thickness over semiconductor substrates.

Semiconductor devices utilize oxide regions, such as silicon dioxide regions, for a variety of applications. For example, oxide regions may be used to form gate oxides. The thickness of the gate oxide can affect various electrical properties of the transistor structures incorporating the gate oxide.

It is often desirable to form gate oxides of different thickness on the same semiconductor substrate. For example, it is desirable to form DRAM devices utilizing a thick gate oxide in the array areas of the semiconductor substrate and to form periphery devices such as logic transistors utilizing a thin gate oxide in the periphery areas of the semiconductor substrate. However, conventional processing techniques are may not be suitable for the formation of high quality gate oxides of different thicknesses.

Thus, there remains a need in the art for methods of dual gate oxides having differing thicknesses. Additionally, there remains a need in the art for methods of forming dual gate oxides of a quality suitable for use in DRAM and other devices.

SUMMARY OF THE INVENTION

The present invention provides methods of forming gates oxides having varying thicknesses. A first gate oxide layer is generally formed over first and second areas of a semiconductor substrate. An oxynitride layer is formed over the first gate oxide layer. A portion of the oxynitride and first gate oxide layers overlying the second area of the semiconductor substrate is then removed. Finally, a second gate oxide layer is grown on the exposed second area of the semiconductor substrate, and a reoxidized first gate oxide is simultaneously formed. The reoxidized first gate oxide is thinner than the second gate oxide. The second gate oxide is suitable for use in memory devices of DRAM, and the reoxidized first gate oxide is suitable for use in the periphery devices of DRAM.

Accordingly, it is an object of the present invention to provide a method of forming dual gate oxides. Further, it is an object of the present invention to provide high quality gate oxides suitable for use in the array and periphery areas of DRAM devices. Additional objects and advantages of the present invention will become apparent from the subsequent drawings and detailed description of the preferred embodiments.

DETAILED DESCRIPTION

Figure 1A:
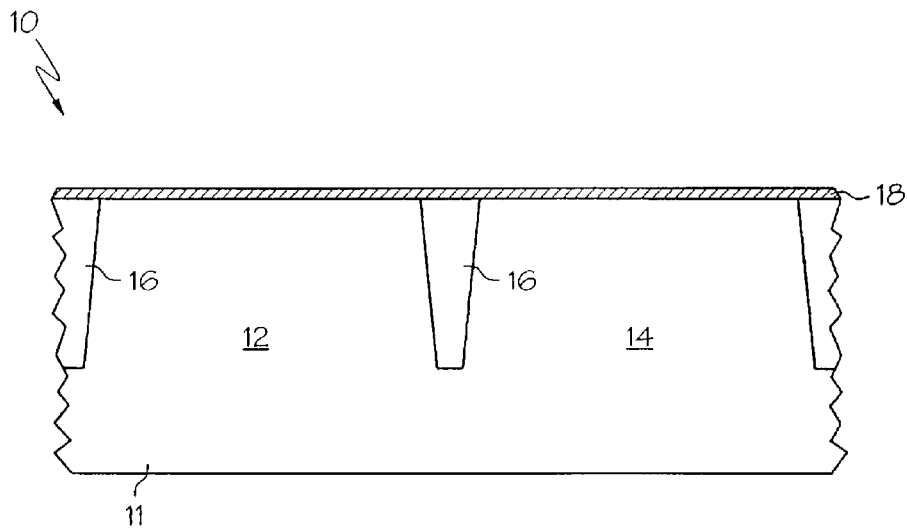
FIGS. 1a–1b illustrate the formation of a first gate oxide and an oxynitride layer on a semiconductor substrate.

The present invention is directed toward methods of forming dual gate oxides. The methods allow gate oxide layers of differing thicknesses to be formed on a semiconductor substrate, and the methods may be easily integrated into semiconductor processing systems.

In the following detailed description, reference is made to the accompanying drawings that form a part hereof, and in which is shown by way of illustration, and not by way of limitation, specific embodiments in which the invention may be practiced. It is to be understood that other embodiments may be utilized and that logical, mechanical, and electrical changes may be made without departing from the spirit and scope of the present invention. In the drawings, like numerals describe substantially similar components throughout the several views.

FIG. 1a shows a semiconductor device 10 having a substrate 11. As used herein, the term "semiconductor substrate" is defined to mean any construction comprising seimiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above.

The semiconductor substrate 11 has at least a first area 12 and a second area 14 defined therein. The semiconductor substrate 11 may have a plurality of first areas 12 and second areas 14 formed therein. Additionally, it will be understood that the first area 12 and the second area 14 do not have to be formed adjacent to one another in the semiconductor substrate 11. The first and second areas 12, 14 may be doped, and generally the dopants in the first and second areas 12, 14 will be different dopants. For example, the first area 12 may be doped with a p-type dopant such as boron. The second area 14 may be doped with an n-type dopant such as phosphorous or arsenic. Isolation regions 16 may separate the first and second areas 12, 14. The isolation regions 16 may be formed in any suitable manner, and the isolation regions 16 may be shallow trench isolation (STI) regions as illustrated or any other suitable isolation region.

A first gate oxide layer 18 is formed over at least some of the first and second areas 12, 14. The first gate oxide layer 18 may similarly be formed over the isolation regions 16. The first gate oxide layer 18 may be formed using any suitable technique. For example, the first gate oxide may be formed using a grown thermal oxide. The first gate oxide layer 18 generally has an initial thickness of between about 15 Å to about 45 Å. More generally, the first gate oxide layer will be between about 20 Å to about 35 Å thick.

Figure 1B:
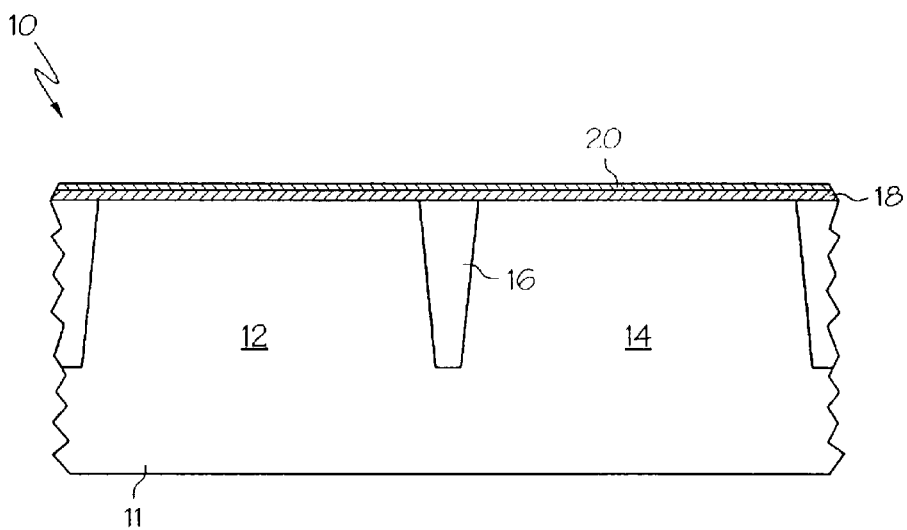

Referring to FIG. 1b, an oxynitride layer 20 is formed over the first gate oxide layer 18. The oxynitride layer 20 may be formed by any suitable method. Generally, the oxynitride layer 20 is formed by plasma nitridation. As used herein, the term plasma nitridation is defined to mean the formation of a nitrogen containing layer by reacting a nitrogen containing plasma with an oxide containing layer. For plasma nitridation, the semiconductor device 10 is generally placed in a processing chamber, a nitrogen source gas such as $N_2$ or $NH_3$ is flowed into the processing chamber, and a nitrogen plasma is formed proximate to the first gate oxide 18. The oxynitride layer 20 is formed as the nitrogen plasma reacts with the first gate oxide layer 18. The oxynitride layer is generally from between about 4 Å to 10 Å thick. Additionally, the oxynitride layer 20 generally has been about 18% to about 25% nitrogen incorporated therein as measured using an X-ray photoelectron spectrometer (XPS).

Figure 2:
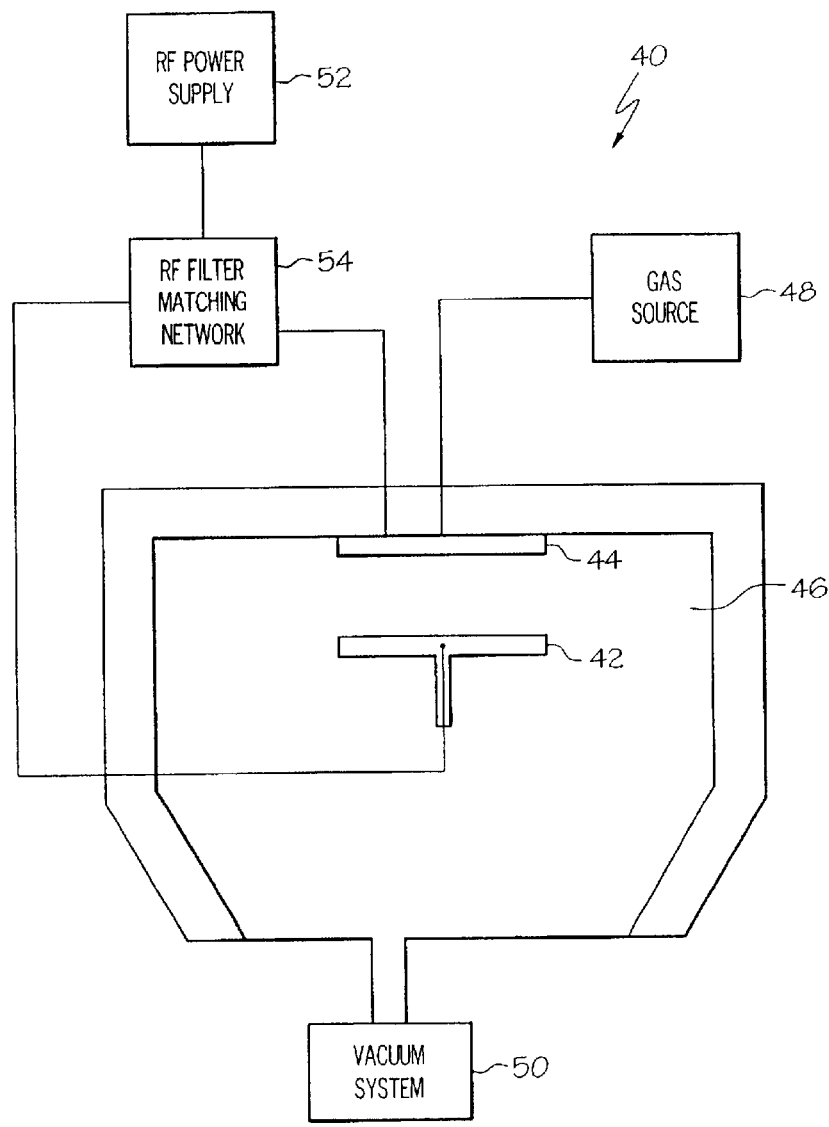
FIG. 2 schematically illustrates a decoupled plasma nitridation system.

The oxynitride layer 20 may be formed using decoupled plasma nitridation (DPN). Referring to FIG. 2, a schematic illustration of a DPN system 40 is provided. The DPN system 40 has a process chamber 46 that is generally under a vacuum provided by the vacuum system 50. The system 40 additionally has a pedestal 42 that holds a substrate to be processed. The pedestal 42 has an electrode (not shown) embedded therein. A showerhead 44 is located over the pedestal 42. The showerhead 44 is generally part of the plasma source (not shown). The showerhead 44 has a gas inlet electrode (not shown), and the showerhead 44 allows source gases from gas source 48 to enter the processing chamber 46. Thus, the showerhead 44 facilitates the formation of a plasma from the source gases over the pedestal 42.

A RF power supply 52 is coupled to the showerhead 44 via the gas inlet electrode and the pedestal 42 via the electrode in the pedestal. The Rf, power supply 52 generally comprises a high frequency RF power supply coupled to the showerhead 44 and a low frequency power supply coupled to the pedestal 42. The high frequency waveform is decoupled from the low frequency waveform by the RF filter and matching network 54. In this manner, the pedestal 42 is decoupled from the showerhead 44 and the plasma source. This decoupling allows better control of the process. For example, an oxynitride layer 20 deposited by DPN will have a larger concentration of nitrogen near the top of the first gate oxide 18. This larger concentration of nitrogen at the top of the gate oxide provides a better barrier to dopants that could migrate from subsequent layers formed over the first gate oxide. An example of a suitable processing system is described in U.S. Pat. No. 6,358,573, which is herein incorporated by reference. If a DPN system is utilized to form the oxynitride layer 20, the DPN may be performed for between about 30 seconds to about 150 seconds. The DPN may be carried out at a power of between about 500–1500 Watts and the processing chamber of the DPN system may be under a pressure of between about 3–50 milliTorr.

Figure 3A:
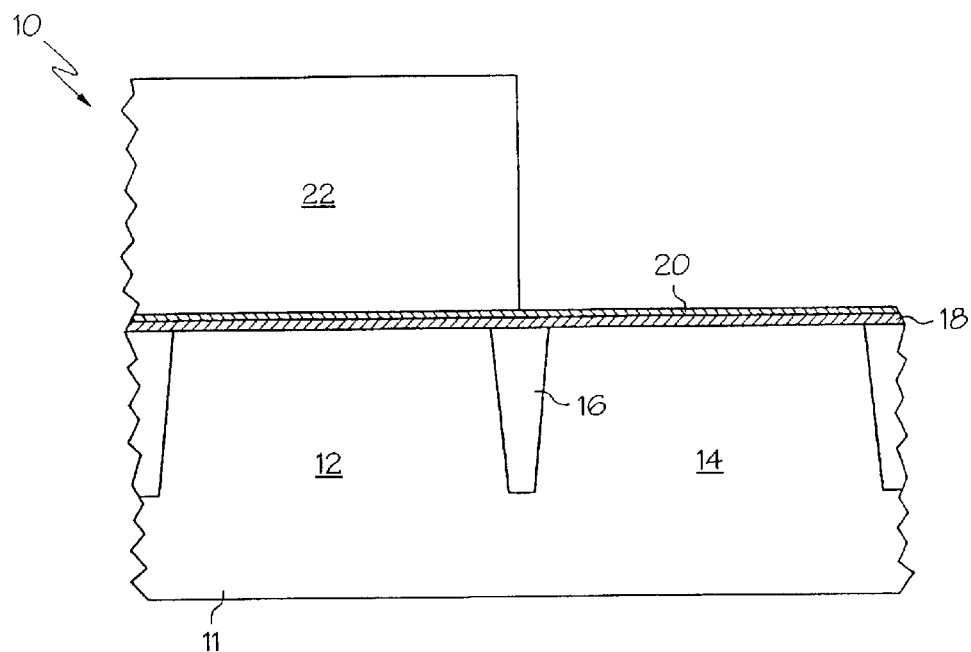
FIGS. 3a–3c illustrate the removal of a portion of the first gate oxide and oxynitride layers.
Figure 3B:
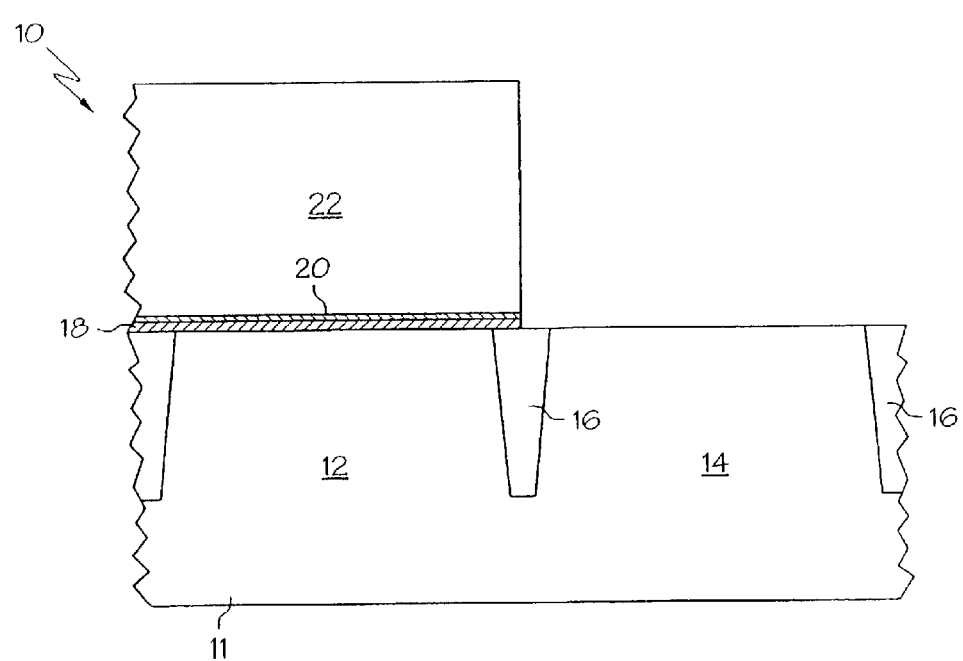
Figure 3C:
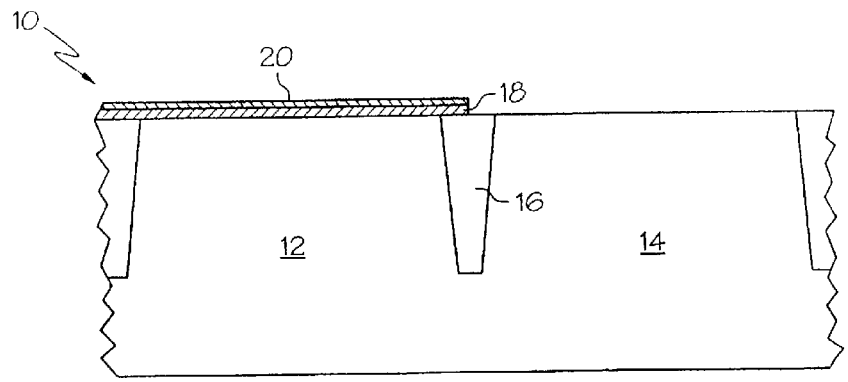

Referring to FIGS. 3a–3c, the formation of a photo pattern using a photoresist layer 22 and the subsequent removal of a portion of the first gate oxide layer 18 is illustrated. As shown in FIG. 3a, a photo pattern is formed using a photoresist layer 22. The photo pattern generally patterns the layer of photoresist 22 over the first gate oxide layer 18 and the oxynitride layer 20 on the first area 12 of the semiconductor substrate 11, and the first gate oxide layer 18 and the oxynitride layer 20 on the second area 14 of the semiconductor substrate 11 is exposed. Any suitable photo pattern method may be employed to pattern the photoresist layer 22.

Once the photoresist layer 22 has been formed, the exposed oxynitride layer 20 and the exposed first gate oxide layer 18 are removed, as shown in FIG. 3b. The oxynitride layer 20 and the first gate oxide layer 18 are generally removed using a wet etch. For example, the layers may be removed using an etchant solution of 100:1 buffered oxide etchant (BOE). The first gate oxide layer 18 is generally removed so that the second area 14 of the substrate 11 is completely exposed. It will be understood by those having skill in the art, that the present invention is not limited to the removal of the oxynitride layer 20 and the first gate oxide layer using a photo pattern and wet etch. Any other suitable method may be employed to remove the layers 18, 20.

After the second area 14 of the substrate 11 has been exposed, the photoresist layer 22 is removed as shown in FIG. 1c. The photoresist layer 22 may be removed by any suitable method. For example, the photoresist layer 22 may be removed by performing a dry etch using plasma ashing. The remaining organic contaminants may be removed by performing a piranha etch utilizing $H_2SO_4$, $H_2O_2$, and $H_2O$. Finally, the device 10 may be subject to a 300:1 HF clean to remove any remaining contaminants.

Figure 4:
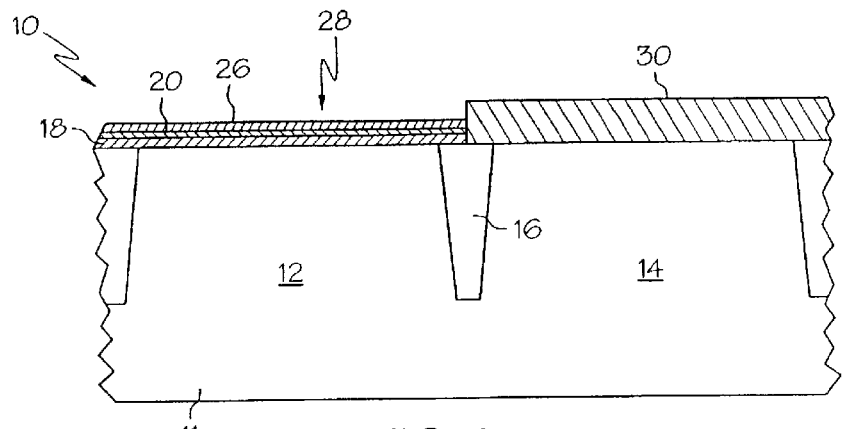
FIG. 4 illustrates the formation of a second gate oxide and a reoxidized first gate oxide.

Referring to FIG. 4, a second gate oxide 30 is grown on the exposed second area 14 of the semiconductor substrate 11. During the growth of the second gate oxide 30, the first gate oxide 18 is simultaneously reoxidized and another layer of gate oxide 26 is formed. Thus, a reoxidized first gate oxide 28 is formed that incorporates oxynitride 20. The second gate oxide 30 and the reoxidized first gate oxide 28 are generally formed by exposing the device to oxidizing conditions. The reoxidized first gate oxide layer 28 is thinner than the second gate oxide layer 30. The reoxidized first gate oxide layer 28 is thinner because the oxynitride layer 20 impedes the rate of reoxidation of the first gate oxide layer 18. Thus, the second gate oxide layer 30 grows at a rate faster than that of the reoxidation of the first gate oxide layer.

The rate of reoxidation of the first gate oxide 18 is dependent on the amount of nitrogen in the oxynitride layer 20. As the amount of nitrogen in the oxynitride layer 20 increases, the rate of reoxidation decreases. Therefore, one skilled in the art may adjust the amount of nitrogen in the oxynitride layer 20 to achieve a desired final thickness of the reoxidized first gate oxide layer 28 relative to the final thickness of the second gate oxide layer 30. The reoxidized first gate oxide layer 28 will generally have a thickness of between about 40 Å to 70 Å, and the thickness will more typically be between about 20 Å to about 35 Å. The second gate oxide layer 30 will generally have a thickness of between about 45 Å to 75 Å, and the thickness will more typically be between about 50 Å to 60 Å.

Thus, the second gate oxide layer 30 is a high quality gate oxide that has a reduced number of defects because it is formed over the exposed second area 14 of the semiconductor substrate. The reoxidzed first gate oxide layer 28 includes a barrier layer of oxynitride 20 that renders the reoxidized first gate oxide layer 28 useful for forming surface p-channel devices.

Figure 5:
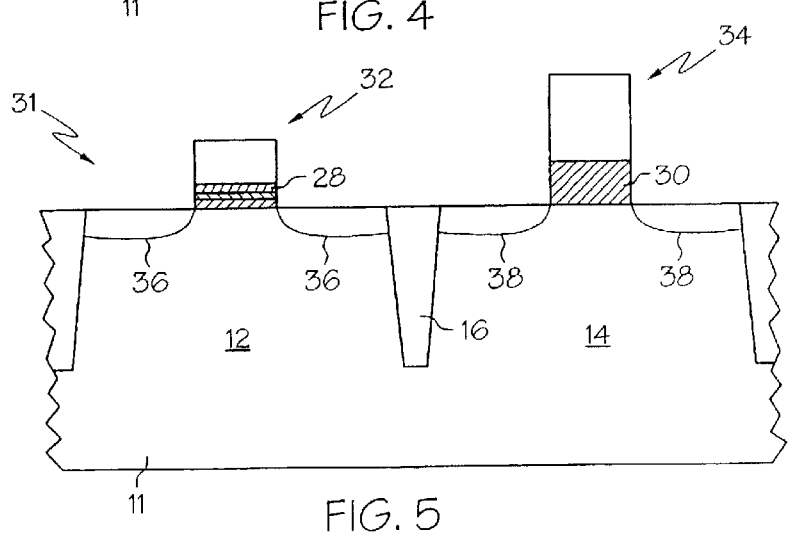
FIG. 5 illustrates the formation of a portion of periphery and array devices for a DRAM device.

Referring to FIG. 5, a portion of a DRAM device having gate stacks 32, 34 is illustrated. The gate oxides 28, 30 of the present invention may be utilized to form portions of a DRAM device 31. The second gate oxide 30 overlying the second area 14 of the semiconductor substrate 11 is suitable for forming portions of the memory devices of the DRAM 31. The reoxidized first gate oxide 28 overlying the first area 12 of the semiconductor substrate 11 is suitable for forming portions of periphery devices of the DRAM 31. Thus, the reoxidized first gate oxide 28 generally overlies the periphery areas of the DRAM, and the second gate oxide 30 generally overlies the array areas of the semiconductor substrate 11. For the purposes of the present invention, "periphery area" is defined as meaning areas of the semiconductor substrate 11 over which periperhy devices are formed. "Array area" is defined as meaning areas of the semiconductor substrate 11 over which memory devices are formed. Periphery devices include transistors, sense amplifiers, row drivers, and the like.

The reoxidized first gate oxide 28 may be used to form a portion of a gate stack 32. The gate stack 32 may form a portion of a transistor including source/drain regions 36. The second area 12 of the semiconductor substrate may be doped to form a p-well. The reoxidized first gate oxide 28 is suitable for use with surface p-channel devices because it contains an oxynitride layer 20 that acts to prevent the movement of dopants through the gate oxide. Thus, surface p-channel devices may be formed over the periphery area.

Similarly, the second gate oxide 30 may be used to form a portion of a gate stack 34, which is part of a transistor including source/drain regions 38. The transistor formed over the array area may be used as a portion of a memory array. The second gate oxide 30 is a high quality oxide that does not have many defects because of the growth process used to form the second gate oxide 30. Therefore, the second gate oxide is suitable for use with n-channel devices requiring a thicker oxide such as transistors in the array area of DRAM. It will be understood by one having skill in the art that a plurality of devices using the reoxidized first gate oxide 28 and the second gate oxide 30 may be formed in a plurality of periphery and array areas on a given semiconductor substrate 11. Additionally, it will be understood by one having skill in the art that any suitable processing regime may be utilized after the formation of the reoxidized gate oxide 28 and the second gate oxide 30 to form the desired devices on the semiconductor substrate.

It will be obvious to those skilled in the art that various changes may be made without departing from the scope of the invention, which is not to be considered limited to what is described in the specification. It shall be observed that the present invention can be practiced in conjunction with a variety of integrated circuit fabrication techniques, including those techniques currently used in the art and any other suitable, yet to be developed techniques.

What is claimed is:

1. A method of forming a dual gate oxide, comprising:
   forming a first gate oxide layer over first and second areas of a semiconductor substrate;
   nitridizing said first gate oxide layer to form an oxynitride layer over said first gate oxide layer;
   removing said oxynitride layer and said first gate oxide layer in an area overlying said second area of said semiconductor substrate, wherein said step of removing is performed to expose said second area of said semiconductor substrate; and
   growing a second gate oxide layer over said second area of said semiconductor substrate while simultaneously reoxidizing said first gate oxide layer such that said reoxidized first gate oxide layer is thinner than said second gate oxide layer.

2. A method of forming a dual gate oxide, comprising:
   forming a first gate oxide layer over first and second areas of a semiconductor substrate;
   nitridizing said first gate oxide layer by plasma nitridization to form an oxynitride layer over said first gate oxide layer;
   removing said oxynitride layer and said first gate oxide layer in an area overlying said second area of said semiconductor substrate, wherein said step of removing is performed to expose said second area of said semiconductor substrate; and
   growing a second gate oxide layer over said second area of said semiconductor substrate while simultaneously reoxidizing said first gate oxide layer such that said reoxidized first gate oxide layer is thinner than said second gate oxide layer.

3. A method of forming a dual gate oxide, comprising:
   forming a first gate oxide layer over first and second areas of a semiconductor substrate;
   nitridizing said first gate oxide layer by plasma nitridization to form an oxynitride layer over said first gate oxide layer;
   patterning a layer of photoresist over said first gate oxide layer and said oxynitride layer on said first area of said semiconductor substrate;
   etching said oxynitride layer and said first gate oxide layer in an area not beneath the pattern of photoresist, wherein said step of etching is performed to expose said second area of said semiconductor substrate;
   removing said layer of photoresist; and
   growing a second gate oxide layer over said second area of said semiconductor substrate while simultaneously reoxidizing said first gate oxide layer such that said reoxidized first gate oxide layer is thinner than said second gate oxide layer.

4. The method as claimed in claim 3 wherein said plasma nitridization comprises decoupled plasma nitridization.

5. A method of forming a dual gate oxide, comprising:
   forming a first gate oxide layer over first and second areas of a semiconductor substrate, wherein said first gate oxide layer has an initial thickness of between about 15 Å to about 45 Å;
   nitridizing said first gate oxide layer by plasma nitridization to form an oxynitride layer over said first gate oxide layer;
   patterning a layer of photoresist over said first gate oxide layer and said oxynitride layer on said first area of said semiconductor substrate;
   etching said oxynitride layer and said first gate oxide layer in an area not beneath the pattern of photoresist, wherein said step of etching is performed to expose said second area of said semiconductor substrate;
   removing said layer of photoresist; and
   growing a second gate oxide layer over said second area of said semiconductor substrate while simultaneously reoxidizing said first gate oxide layer, wherein said reoxidized first gate oxide layer is between about 40 Å to about 70 Å thick and said second gate oxide layer is between about 45 Å to about 75 Å thick.

6. The method as claimed in claim 5 wherein said first gate oxide layer has an initial thickness of between about 20 Å to about 35 Å, wherein said reoxidized first gate oxide layer is between about 40 Å to about 50 Å thick, and wherein said second gate oxide layer is between about 50 Å to about 60 Å thick.

7. A method of forming a dual gate oxide, comprising:
   forming a first gate oxide layer over first and second areas of a semiconductor substrate;
   nitridizing said first gate oxide layer by plasma nitridization to form an oxynitride layer over said first gate oxide layer, wherein said oxynitride film comprises between about 18% to about 25% nitrogen;
   patterning a layer of photoresist over said first gate oxide layer and said oxynitride layer on said first area of said semiconductor substrate;
   etching said oxynitride layer and said first gate oxide layer in an area not beneath the pattern of photoresist, wherein said step of etching is performed to expose said second area of said semiconductor substrate;
   removing said layer of photoresist; and
   growing a second gate oxide layer over said second area of said semiconductor substrate while simultaneously reoxidizing said first gate oxide layer such that said reoxidized first gate oxide layer is thinner than said second gate oxide layer.

8. A method of forming a dual gate oxide, comprising:
   forming a first gate oxide layer over first and second areas of a semiconductor substrate;
   nitridizing said first gate oxide layer by decoupled plasma nitridization to form an oxynitride layer over said first gate oxide layer, wherein said oxynitride film comprises between about 18% to about 25% nitrogen, and wherein said first gate oxide layer has an initial thickness of between about 15 Å to about 45 Å;

patterning a layer of photoresist over said first gate oxide layer and said oxynitride layer on said first area of said semiconductor substrate;

etching said oxynitride layer and said first gate oxide layer in an area not beneath the pattern of photoresist, wherein said step of etching is performed to expose said second area of said semiconductor substrate;

removing said layer of photoresist; and growing a second gate oxide layer over said second area of said semiconductor substrate while simultaneously reoxidizing said first gate oxide layer, wherein said reoxidized first gate oxide layer is between about 40 Å to about 70 Å thick and said second gate oxide layer is between about 45 Å to about 75 Å thick.

9. A method of forming a dual gate oxide, comprising:

forming a first gate oxide layer over first and second areas of a semiconductor substrate;

forming an oxynitride layer on said first gate oxide, wherein said oxynitride layer is formed by plasma nitridization, and wherein the amount of nitrogen in the oxynitride layer is controlled by controlling said plasma nitridization;

removing said oxynitride layer and said first gate oxide layer in an area overlying said second area, wherein said step of removing is performed to expose said second area of said semiconductor substrate;

growing a second gate oxide layer over said second area of said semiconductor substrate while simultaneously reoxidizing said first gate oxide layer such that said reoxidized first gate oxide layer is thinner than said second gate oxide layer, wherein said reoxidation of said first gate oxide proceeds at a rate that decreases as said amount of nitrogen in said oxynitride film increases.

10. The method as claimed in claim 9 wherein said first gate oxide layer has an initial thickness of between about 20 Å to about 35 Å, wherein said reoxidized first gate oxide layer is between about 40 Å to about 50 Å thick, and wherein said second gate oxide layer is between about 50 Å to about 60 Å thick.

11. The method as claimed in claim 8 wherein said oxynitride film comprises between about 18% to about 25% nitrogen.

12. A method of forming a dual gate oxide, comprising:

forming a first gate oxide layer over first and second areas of a semiconductor substrate;

forming an oxynitride layer on said first gate oxide, wherein said oxynitride layer is formed by decoupled plasma nitridization, and wherein the amount of nitrogen in the oxynitride layer is controlled by controlling said decoupled plasma nitridization;

removing said oxynitride layer and said first gate oxide layer in an area overlying said second area of said semiconductor substrate, wherein said step of removing is performed to expose said second area of said semiconductor substrate;

growing a second gate oxide layer over said second area of said semiconductor substrate while simultaneously reoxidizing said first gate oxide layer such that said reoxidized first gate oxide layer is thinner than said second gate oxide layer, wherein said reoxidation of said first gate oxide proceeds at a rate that decreases as said amount of nitrogen in said oxynitride film increases.

13. The method as claimed in claim 12 wherein said decoupled plasma nitridization is performed for between about 30 seconds to about 150 seconds.

14. The method as claimed in claim 12 wherein said decoupled plasma nitridization is carried out at a power of between about 500 to about 1500 Watts.

15. The method as claimed in claim 12 wherein said decoupled plasma nitridization is carried out in a plasma processing chamber under a pressure of between about 3 to about 50 milliTorr.

16. A method of forming a dual gate oxide, comprising:

providing a semiconductor substrate having at least one periphery area and at least one array area separated by at least one isolation region;

forming a first gate oxide layer overlying said at least one periphery area, said at least one array area, and said at least one isolation region;

nitridizing said first gate oxide layer by plasma nitridization to form an oxynitride layer over said first gate oxide layer;

patterning a layer of photoresist over said first gate oxide layer and said oxynitride layer on said at least one periphery area of said semiconductor substrate;

etching said oxynitride layer and said first gate oxide layer in an area not beneath the pattern of photoresist, wherein said step of etching is performed to expose said at least one array area of said semiconductor substrate;

removing said layer of photoresist; and growing a second gate oxide layer over said second area of said semiconductor substrate while simultaneously reoxidizing said first gate oxide layer such that said reoxidized first gate oxide layer is thinner than said second gate oxide layer.

17. A method of forming a dual gate oxide, comprising:

providing a semiconductor substrate having at least one periphery area and at least one array area separated by at least one isolation region;

forming a first gate oxide layer overlying said at least one periphery area, said at least one array area, and said at least one isolation region;

nitridizing said first gate oxide layer by plasma nitridization to form an oxynitride layer over said first gate oxide layer;

patterning a layer of photoresist over said first gate oxide layer and said oxynitride layer on said at least one periphery area of said semiconductor substrate;

etching said oxynitride layer and said first gate oxide layer in an area not beneath the pattern of photoresist, wherein said step of etching is performed to expose said at least one array area of said semiconductor substrate;

removing said layer of photoresist; and growing a second gate oxide layer over said second area of said semiconductor substrate while simultaneously reoxidizing said first gate oxide layer such that said reoxidized first gate oxide layer is thinner than said second gate oxide layer, wherein:

said first gate oxide layer overlying said at least one periphery area is suitable for use with p-channel devices; and said second gate oxide layer overlying said at least one array area is suitable for use with n-channel devices.

18. A method of fabricating a DRAM device, comprising:

providing a semiconductor substrate having at least one periphery area and at least one array area separated by at least one isolation region;

forming a first gate oxide layer overlying said at least one periphery area, said at least one array area, and said at least one isolation region;

nitridizing said first gate oxide layer by plasma nitridization to form an oxynitride layer over said first gate oxide layer;

patterning a layer of photoresist over said first gate oxide layer and said oxynitride layer on said at least one periphery area of said semiconductor substrate;

etching said oxynitride layer and said first gate oxide layer in an area not beneath the pattern of photoresist, wherein said step of etching is performed to expose said at least one array area of said semiconductor substrate;

removing said layer of photoresist;

growing a second gate oxide layer over said second area of said semiconductor substrate while simultaneously reoxidizing said first gate oxide layer such that said reoxidized first gate oxide layer is thinner than said second gate oxide layer;

defining at least one semiconductor device over said periphery area, wherein said at least one semiconductor device utilizes at least a portion of said first gate oxide layer; and defining at least one memory device over said array area, wherein said at least one memory device utilizes at least a portion of said second gate oxide layer.

19. The method as claimed in claim 18 wherein said first gate oxide layer has an initial thickness of between about 20 Å to about 35 Å, wherein said reoxidized first gate oxide layer is between about 40 Å to about 50 Å thick, and wherein said second gate oxide layer is between about 50 Å to about 60 Å thick.

20. The method as claimed in claim 18 wherein said oxynitride film comprises between about 18% to about 25% nitrogen.

21. A method of fabricating a DRAM device, comprising:

providing a semiconductor substrate having at least one periphery area and at least one array area separated by at least one isolation region;

forming a first gate oxide layer overlying said at least one periphery area, said at least one array area, and said at least one isolation region;

nitridizing said first gate oxide layer by plasma nitridization to form an oxynitride layer over said first gate oxide layer;

patterning a layer of photoresist over said first gate oxide layer and said oxynitride layer on said at least one periphery area of said semiconductor substrate;

etching said oxynitride layer and said first gate oxide layer in an area not beneath the pattern of photoresist, wherein said step of etching is performed to expose said at least one array area of said semiconductor substrate;

removing said layer of photoresist;

growing a second gate oxide layer over said second area of said semiconductor substrate while simultaneously reoxidizing said first gate oxide layer such that said reoxidized first gate oxide layer is thinner than said second gate oxide layer;

defining at least one surface p-channel device over said periphery area, wherein said at least one semiconductor device utilizes at least a portion of said first gate oxide layer; and defining at least one n-channel memory device over said array area, wherein said at least one memory device utilizes at least a portion of said second gate oxide layer.

22. A method of fabricating a DRAM device, comprising:

providing a semiconductor substrate having at least one periphery area and at least one array area separated by at least one isolation region;

forming a first gate oxide layer overlying said at least one periphery area, said at least one array area, and said at least one isolation region, wherein said first gate oxide layer has an initial thickness of between about 20 Å to about 35 Å;

nitridizing said first gate oxide layer by plasma nitridization to form an oxynitride layer over said first gate oxide layer;

patterning a layer of photoresist over said first gate oxide layer and said oxynitride layer on said at least one periphery area of said semiconductor substrate;

etching said oxynitride layer and said first gate oxide layer in an area not beneath the pattern of photoresist, wherein said step of etching is performed to expose said at least one array area of said semiconductor substrate;

removing said layer of photoresist;

growing a second gate oxide layer over said second area of said semiconductor substrate while simultaneously reoxidizing said first gate oxide layer, wherein said reoxidized first gate oxide layer is between about 40 Å to about 70 Å thick and said second gate oxide layer is between about 45 Å to about 75 Å thick;

defining at least one surface p-channel device over said periphery area, wherein said at least one semiconductor device utilizes at least a portion of said first gate oxide layer; and defining at least one n-channel memory device over said array area, wherein said at least one memory device utilizes at least a portion of said second gate oxide layer.

\* \* \* \* \*